(12) United States Patent
Schreier et al.

(10) Patent No.: US 7,479,305 B2
(45) Date of Patent: Jan. 20, 2009

(54) IMMERSION PLATING OF SILVER

(75) Inventors: Hans-Jürgen Schreier, Velten (DE); Hartmut Mahlkow, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 820 days.

(21) Appl. No.: 10/521,085

(22) PCT Filed: Sep. 6, 2002

(86) PCT No.: PCT/EP02/09997

§ 371 (c)(1), (2), (4) Date: Jan. 13, 2005

(87) PCT Pub. No.: WO2004/007798

PCT Pub. Date: Jan. 22, 2004

(65) Prior Publication Data

US 2006/0165909 A1  Jul. 27, 2006

(30) Foreign Application Priority Data

Jul. 17, 2002 (EP) ................ 02090262

(51) Int. Cl.
  *B05D 1/18* (2006.01)
  *B05D 1/36* (2006.01)
(52) U.S. Cl. ............... 427/436; 427/435; 427/404; 427/405
(58) Field of Classification Search ........ 427/430.1, 427/402, 404, 436, 435
See application file for complete search history.

(56) References Cited

U.S. PATENT DOCUMENTS

| 3,917,885 A | 11/1975 | Baker | |
| 4,529,667 A * | 7/1985 | Shiga et al. | 428/646 |
| 5,733,599 A * | 3/1998 | Ferrier et al. | 427/97.1 |
| 5,882,802 A * | 3/1999 | Ostolski | 428/570 |
| 6,034,422 A | 3/2000 | Horita et al. | |
| 6,180,179 B1 * | 1/2001 | Kawaguchi et al. | 427/405 |
| 2002/0152925 A1 * | 10/2002 | Soutar et al. | 106/1.22 |
| 2003/0000846 A1 * | 1/2003 | Rzeznik et al. | 205/263 |

FOREIGN PATENT DOCUMENTS

| DE | 100 50 862 A1 | 4/2002 |
| EP | 0 797 380 A1 | 9/1997 |
| EP | 0 797 690 B1 | 10/1997 |
| EP | 0 876 306 B1 | 11/1998 |
| EP | 1 024 211 A2 | 8/2000 |
| GB | 967 681 | 8/1964 |
| JP | 03-002379 | 1/1991 |
| JP | A-HEI-03/233993 | 10/1991 |
| JP | 06-299375 | 10/1994 |
| JP | A-HEI-09/199655 | 7/1997 |
| JP | A-HEI-10/130855 | 5/1998 |
| JP | A-HEI-10/330950 | 12/1998 |
| JP | A-2002/180259 | 6/2002 |
| WO | WO 02/29132 A1 | 4/2002 |
| WO | WO 0229132 * | 4/2002 |

OTHER PUBLICATIONS

A. Il'Chenko et al., "Reactions of Substituted Phenazinium Salts With Nucleophilic Reagents", Khimiya Geterotsiklicheskikh Soedinenii (1972), (10) 1425-9. (Abstract).

* cited by examiner

*Primary Examiner*—Timothy H Meeks
*Assistant Examiner*—David Turocy
(74) *Attorney, Agent, or Firm*—Frank J. Bonini, Jr.; John F. A. Earley, III; Harding, Earley, Follmer & Frailey

(57) ABSTRACT

The problem in forming solderable and bondable layers on printed circuit boards is that the surfaces tarnish after storage of the boards prior to further processing (mounting of the electrical components), thus affecting solderability and bondability. In order to overcome this problem it is suggested to deposit, in a first method step, a first metal which is more noble than copper to the printed circuit board and to plate silver in a second method step with the proviso that the first metal be deposited at a rate that is at most half the rate of silver in the second method step when the first metal is silver.

15 Claims, No Drawings

IMMERSION PLATING OF SILVER

The invention relates to a method for displacement plating plating of silver by a displacement reaction, more specifically for producing printed circuit boards, preferably for forming solderable and bondable layers on the soldering and bonding pads.

In the production of printed circuit boards and other circuit carriers, a solder layer consisting of tin/lead metal has heretofore been applied with liquid solder onto the deoxidized copper surfaces in order to electrically fasten components such as resistors, capacitors and semiconductor components, excess liquid solder being subsequently removed from the surfaces and more specifically from the holes by means of a hot air jet (air knife). This method is known under the name of Hot-Air-Leveling technique (HAL process). In most cases, the HAL process is only performed after a solder resist mask consisting of a polymer film has been applied onto the surfaces of the printed circuit board with the exception of the areas in which the components are to be soldered. As a result thereof, the liquid solder only gets to the locations on the printed circuit boards where the components are to be electrically contacted.

After the tin/lead layer is formed, the components may be either mounted by sticking the pins of the components through the holes or are surface mounted onto the printed circuit board where they are soldered. As it often happens that the components are mounted and soldered a fairly long time after production of the circuit structures on the printed circuit boards only, the copper surfaces oxidize so that their ability to be wetted by liquid solder is extremely reduced. Accordingly, the circuit structures should be deoxidized prior to soldering. In forming the tin/lead layer on the circuit structures, the latter are prevented from oxidizing so that the components may be mounted and soldered at a later stage without any problem. Accordingly, the layers produced with the HAL process also serve to protect the copper surfaces from progressive oxidation. As a result thereof, areas prepared with the HAL process are very easy to wet with solder. Furthermore, the surfaces of the printed circuit boards resist oxidation and other tarnishing processes.

Although essentially thickness uniformity of the tin/lead layer may be achieved in carrying out the HAL process by means of an air knife, still considerable thickness differences remain on the surfaces of the printed circuit boards. As the circuit density increases and automatic mounting of the components is being introduced, the circuit structures must be formed with surfaces as planar as possible, which is not possible with the HAL process. Also, as the distances between the connecting pads for the components diminish, solder bridge formation between them occurs more frequently. Therefore, alternative methods have been sought to replace HAL process and to avoid thus the disadvantages of the tin/lead layers formed by HAL on the copper surfaces. A primary object is to prevent oxidation of the copper surfaces and concurrently to meet the demands resulting from the ever-increasing miniaturization and automation of the component mounting process.

One approach to, mitigate these problems consists in forming a combined layer of nickel and gold. As the circuit structures to be coated are generally electrically insulated from each other, the two metal layers are electroless plated to the copper surfaces. In using electroless plating, it is not necessary to connect electrically the areas of the copper surfaces to be plated to an external power source.

The nickel/gold final layer is particularly suited for applications that have to meet highest quality requirements. It is both solderable and bondable and provides excellent anti-tarnish protection. It may furthermore be utilized to produce electrical contact areas, in switches and plug contacts for example. This technique is very expensive though, so that its application is limited to high-quality circuits. It is not suited for mass application.

Another high-quality end surface is formed by electroless plating the copper surfaces with palladium. Best solderability may be achieved with a 0.2 µm thick palladium layer deposited on copper. Furthermore, the palladium surfaces are also suited to produce contact areas on the printed circuit boards because of their reduced contact resistance. Due to the high price of palladium, its use in mass production must be excluded, though.

The formation of an organic protective layer consisting of alkyl imidazoles or alkyl benzimidazoles on the copper areas is much cheaper than a coating made of the combined layer of nickel and gold or of palladium. These protective layers provide effective tarnish resistance, thus preventing the copper surfaces from oxidizing. They are moreover very thin so that the disadvantages due to an irregular thickness distribution as with the HAL layers are avoided.

A disadvantage thereof however is that the organic protective layers mentioned are not fully suited to bond unhoused semiconductor components that are placed directly onto the printed circuit boards. Moreover, it is not possible to solder one more time a printed circuit board that has already been subjected to a soldering process as the organic protective layer is destroyed during the first soldering operation. Also, the advantage of the nickel/gold combined layer and of the palladium layer that permit to form electrical contact areas on the printed circuit boards cannot be realized with the organic protective layers.

Another alternative method is to tin-plate the copper surfaces of the circuit structures with a displacement reaction by charge transfer with the copper. But, just as the organic protective layers, the tin layers provide but a small tarnish resistance. Furthermore, they do not allow to produce multifunctional surfaces since it is not possible to make electrical contacts with tin surfaces. The solderability of the tin layers is given since the tin layer also provides tarnish resistance. Multiple soldering steps however are only possible under certain conditions. Furthermore, it is not possible to produce contact layers for switches and plug contacts.

Silver-plating involves costs that may be compared to tin plating. With but small thicknesses a final silver layer on copper already meets many conditions of a modern final layer. More specifically, silver layers may not only be utilized for soldering applications but for bonding applications as well. Furthermore, these layers also have a very low contact resistance so that they may also be utilized to form plug contacts on printed circuit boards as well as switches.

The known methods for depositing silver onto copper are based on the so-called immersion plating method which makes use of a displacement plating reaction according to equation A:

$$Cu + Ag^+ \rightarrow Cu^+ + Ag \qquad\qquad A$$

The silver layer may be about 0.2 µm thick. It protects the copper from oxidation. The silver surface furthermore allows multiple soldering steps. The layer is planar and is also suited for press-fit technology by which the connecting pins of electrical components are mechanically pressed into the holes provided in the printed circuit board in an effort to make an electrical contact with the circuit structures. Even after ageing a printed circuit board provided with silver surfaces with heat and vapor treatment, the results as to solderability could be compared to those of a classical HAL surface.

The solderability of the silver layers produced proved still insufficient after storage. As a result thereof, various improvements have been proposed:

EP 0 797 690 B1 discloses a method of coating a printed circuit board by metal plating the copper areas thereof with a layer of silver by way of a displacement reaction. The silver bath may contain, i.a., tarnish inhibitors for the purpose of ensuring solderability post storing. The tarnish inhibitors mentioned include but are not limited to substituted imidazolines, alkyl imidazoles and alkyl benzylimidazoles, benzimidazoles, triazole derivatives and substituted tetrazoles. The tarnish inhibitors may also be used in post-treatment after silver-plating. A disadvantage of this method is that the tarnish inhibitors have, in some cases, an impact on the environment. After a fairly long storage time, the solderability and bondability proved to be very good in some areas of a printed circuit board, in others however, the corrosion resistance dropped considerably.

EP 0 797 380 A1 discloses a method for enhancing the solderability of copper surfaces, more specifically of printed circuit boards, in which a silver layer is applied to the surfaces by a displacement reaction prior to soldering. The silver layer is formed by contacting the surfaces with an acidic plating solution containing a silver imidazole complex. The preferred source of silver ions used is silver nitrate.

U.S. Pat. No. 5,733,599 describes a process for enhancing the solderability of a surface in which a copper-plated printed circuit board material is at first coated with a layer of silver by immersion plating, another metal layer being applied to said layer of silver, said metal being selected from the group consisting of gold, ruthenium, rhodium and palladium. The silver plating solution preferably contains silver nitrate, methane sulfonic acid and histidine in order to achieve enhanced solderability of the surfaces.

In Patent Abstracts of Japan regarding JP 03-002379 A there is described a method for forming a layer of silver on copper, the plating bath containing, in addition to silver nitrate, an alkyl imidazole compound and an organic acid or the salt thereof.

In Patent Abstracts of Japan regarding JP 06-299375 A there is furthermore described a processing method for metallic surfaces in which silver is i.a. coated with a chemical conversion layer in order to achieve improved resistance against humidity, chemical influences and action of heat, thus enhancing the solder properties. To form the chemical conversion layer, the silver surface is contacted with an aqueous solution containing a derivative of imidazole.

EP 1 024 211 A2 furthermore describes a silver alloy plating that contains, in addition to silver ions at least one metal selected from a group consisting of palladium ions, platinum ions, gold ions and rhodium ions. It states that the oxidation resistance of the layers deposited by means of this bath increases considerably thanks to these alloying metals.

The known methods for enhancing the solderability on copper surfaces present the following disadvantages:

The thickness of the outer layers formed to enhance solderability is often not uniform. Furthermore, it may be very expensive to produce such layers, particularly in the case of a nickel/gold or a palladium layer. In some cases, constituents are used in their production that have a serious impact on the environment like e.g., solutions containing chromium (VI). In many cases, the layers formed are not suited to make bond connections and electrical contacts. Furthermore, the bath described in EP 1 024 211 A2 has the disadvantage that the composition of the alloy affects the oxidation resistance of the protective layer. As the alloy composition in turn depends i.a. on the relative concentrations of silver and of the alloying metal ions in the plating solution, control of the layer properties with regard to the anti-tarnishing properties is quite complicated.

Furthermore, DE 100 50 862 A1 suggests to utilize a bath and a method for immersion plating of silver on surfaces made of a metal less noble than silver, more specifically on copper surfaces. The bath contains at least one silver halide complex but no reducing agent for silver ions. The silver halide complex is the silver bromide complex of preference. However, the bath described in this document has the disadvantage that benzotriazole compounds must be added in order to achieve good soldering results. The benzotriazole compounds serve primarily to protect the silver layer from oxidation and from the risk of corrosion products forming from the atmosphere in the form of silver-sulfur compounds for example. After a short period of operation of the bath, the silver layers produced were slightly yellowish and had no longer the white silver color they had when the bath was freshly prepared. This discoloration of the silver layer increases after an ageing treatment with dry heat (4 hours, 155° C.) and with a vapor test (4 hours, 98-100° C.) and is considered to be responsible for the strong reduction in solder wetting of the silver layer.

EP 0 876 306 B1 furthermore discloses a method of applying a silver layer to a glass substrate in which a first silver layer is deposited prior to depositing a second silver layer. The first silver layer is electroless plated, whereas the second silver layer is applied by electroplating. The deposition rate for the first silver layer is indicated to be 300 nm/hour. During the electrolytic deposition of silver, a layer having a thickness of 2 µm is deposited within one minute.

U.S. Pat. No. 3,917,885 furthermore describes a method for the autocatalytic plating of metallic and non-metallic substrates with copper, silver or gold in the presence of a reducing agent, which, even in case of catalytically active substrates such as copper substrates are to be metal-plated, the method consisting in depositing a first layer of gold at first in order to prevent the autocatalytic bath from being contaminated by the substrate material dissolving therein. The first gold layer deposited has a thickness of 2 to 5 microinches.

The drawback of all the known methods utilizing the anti-tarnishing compounds mentioned is that these agents are generally to be utilized in relatively high concentrations in order to become effective and that, as a rule, these agents have an impact on the environment. It furthermore proved disadvantageous that in these cases the silver layers formed are provided with a relatively rough surface due to dendrites.

It is therefore an objcet of the present invention to avoid the drawbacks of the known methods and to more specifically find a method by means of which solderable and bondable layers may be formed on the copper surfaces of soldering and bonding pads, the solderability and bondability remaining sufficiently high even after a fairly long storage time. The method should be easy to carry out without complicated process control. The bonding strength of the solderable and bondable protective layer should moreover be very good and the layers formed should be deposited in a very uniform manner even on larger copper areas.

The method in accordance with the invention serves to plate silver by a displacement reaction onto a substrate provided with a copper surface, preferably without using a reducing agent for the metal to be deposited. Silver deposition by plating via a displacement reaction is to be construed as a deposition in which the base metal is dissolved in favor of the metal deposited.

To form the solderable and bondable surfaces a) a first metal which is more noble than copper is deposited on the substrate in a first method step and b) silver is plated by displacement reaction on said substrate in a second method step.

If the first metal is silver, this first metal deposited in the first method step is deposited at a rate which amounts to at most half the rate of the silver plating in the second method step. The first metal is preferably deposited at a rate that amounts to at most 30%, and more specifically 15% of the rate at which silver is plated in the second method step.

The deposition rate of silver in the first method step is defined by the mass of silver deposited within a predetermined length of time onto a predetermined surface area of the substrate, for example 1 $dm^2$. To determine the deposition rate, silver deposited onto the substrate surface is stripped off again according to the given definition by means of chemical means (e.g. concentrated nitric acid) and the amount of stripped off silver is determined analytically. Silver may be determined by atomic absorption spectrometry for example.

The plating rate of silver for forming the solderable and bondable layers in the second method step preferably amounts to 5-10 mg/min·$dm^2$. Accordingly, the deposition rate of silver in the first method step preferably ranges from 2-5 mg/min·$dm^2$, more preferred from 0.2-2.0 mg/min·$dm^2$ and most preferred from 0.7-1.5 mg/min·$dm^2$.

As compared to known methods, particularly to the method described in EP 0 797 690 B1, the method in accordance with the invention is characterized in that the silver layer is provided with improved properties. By this it is meant that the solderability and bondability obtained, particularly after ageing/storage of the layer, is improved over those obtained after formation of the protective layer according to EP 0 797 690 B1. The improved solderability results in the fact that the layer produced in accordance with the method of the invention is significantly faster wetted by the solder after ageing than the layer produced according to EP 0 797 690 B1.

To simulate the solderability post ageing, the substrate coated with the protective layer is stored after production in a dry atmosphere for four hours at 155° C. in a first test prior to carrying out the wetting test. Furthermore, in a second test, the coated substrate is stored in a vapor atmosphere over boiling water for four hours at 98-100° C. Thus in both cases, corrosion tests are carried out and the formation of corrosion products is examined. The layers produced on substrates provided with a copper surface according to the method described in EP 0 797 690 B1 proved to turn red after the corrosion tests. This is indicative of the formation of corrosion products originating from the copper surface. By contrast, the substrates provided with a layer produced according to the method of the invention remained completely bright and silvery even after the corrosion tests were performed. This difference confirms the different results with regard to the ability of the substrates to be wetted by the solder that were obtained by coating with the known silver layers on the one hand and with layers produced according to the method of the invention on the other hand.

Furthermore, the bonding strength of the silver layer on copper surfaces is increased when utilizing the method of the invention. If no previous metal depositing step is carried out on the copper surfaces, the silver layer may already be completely stripped off the support in a so-called tape test. To carry out this test, an adhesive tape is strongly bonded to the surface of the silver layer and then abruptly stripped off. Examination of the layers deposited according to the invention showed that the silver layer remains strongly bonded to the copper surface.

Finally, the layers formed in accordance with the method of the invention are more uniform: in using the method described in EP 0 797 690 B1 to deposit the layer for example, said layer first deposits on the borders of the substrate, and not yet in the center. The silver layer only forms in the center when the borders have already been coated with a dense layer of silver, said layer having a "cloudy" appearance, i.e., the layer is still extremely thin at these places so that it allows the underlying copper surface to shine through. In using the method in accordance with the invention, the layer formed is uniform in all the surface areas of the substrate so that, when the layer formed on the borders of the substrate is dense, it is dense in the center of the areas of the substrate as well. As a result thereof, the layer formed is uniform on all the surface areas of the substrate.

Accordingly, the silver layer formed is continuous and non-porous, thus ensuring that printed circuit boards treated in this manner may be soldered and bonded without any problem and that the connecting pins of electrical components may be readily mechanically press-fitted in through-plated holes in printed circuit boards. Moreover, printed circuit boards already contacted with liquid solder may be soldered once more, to repair the boards for example.

As the silver layers formed during the plating method provide a continuous and non-porous coating on the copper surfaces, the thus protected copper surfaces have good soldering properties even after a fairly long storage time under test conditions using humidity and/or heat for example under which oxide layers easily form although the thickness of the layers is preferably less than 1 µm. As a result thereof it is possible to store printed circuit boards with copper surfaces that have been pretreated in this way after manufacture of the conductor lines and pads prior to mount the electrical components to said printed circuit boards. As a result thereof, both the surface areas of the bores and the pads serving to electrically contact the components, and possibly the conductor lines as well, are protected. Prior to silver-plating, the conductor lines are however usually coated with a solder resist that covers the printed circuit board except for those regions in which electrical components are to be mounted. Accordingly, the layer of solder resist is usually at first applied to the outer sides of the printed circuit board where it is structured and a silver layer is next deposited onto the bare copper areas.

The method of the invention may therefore be used in a particularly advantageous manner in the production of printed circuit boards. In this case the copper areas of the printed circuit board material are coated with silver. As a matter of course, other applications may be thought of such as e.g., silver-plating for decorative purposes or in the production of coatings provided with very good electrically conductive properties, like for example in electrical waveguides.

As a result thereof, the method for forming protective layers of silver on copper surfaces, on printed circuit boards in particular, serves to subsequently carry out a soldering process, a bonding process, the press-fit technology and/or to make electrical contacts. The invention relates in particular to the production of pure silver layers.

The boards provided with such silver layers meet all of the usual requirements for use in the printed circuit board technique. More specifically, demands on sufficient ability to be wetted with solder even after ageing under diverse conditions are met. Furthermore, the silver layers permit to also form electrical contact areas for producing switches and plug contacts.

The metal formed in the first step of the process is more noble than copper. This means that the electromotive force (electrochemical normal potential) of this metal is more positive than the electromotive force of copper obtained in comparison with any reference electrode, e.g., with a silver/silver chloride electrode, when the copper surface is contacted with the deposition bath for the first metal. This condition makes certain that the first metal may be plated onto the copper surfaces by a displacement reaction. This term indicates that the metallic copper of the copper surface is dissolved in favor of the first metal to be deposited. An example of silver deposition on copper surfaces is given by the above mentioned equation A. In the displacement reaction of the displacement plating process, no external power source and no additional reducing agent is needed for the deposition of the first metal.

In a preferred embodiment of the invention, the metal formed in the first method step is palladium or gold. In principle, metals other than palladium or gold such as ruthenium or rhodium or another element from group VIII of the Periodic Table of Elements may also be utilized. Palladium and the other metals mentioned are preferred over gold since, in using gold on the base material, the bonding strength of the silver layer is generally reduced over that obtained when using palladium (or another metal) for forming the first metal layer.

If one of the metals mentioned herein above are utilized to form the metal deposits on the copper surfaces prior to plating, in a subsequent stage, the actual solderable and bondable silver layer, the silver layer obtained in the second step is more compact and uniform and is provided with a higher bonding strength on the substrate than with known methods. The solderable and bondable silver layer proved to be more fine-grained than when the first metal was not deposited prior to silver-plating.

Since the first metal is preferably deposited onto the copper surfaces in very small quantities, it is assumed that the first metal does not form a continuous metal layer on the copper surface. Accordingly, although the subsequently deposited solderable and bondable silver layer is probably formed directly on the copper surfaces over large areas, the advantages described are still obtained. Although the following theoretical interpretation is not intended to limit the scope of protection of the invention, the advantages observed are attributed to the fact that the first metal deposited onto the copper surface probably impresses an electric potential to the copper surface that is more positive than that of the copper surface with such first metal deposit. The silver plating is delayed as a result thereof so that the silver can plate in a more compact manner than with the prior art methods. The advantageous properties of the silver layer are thus achieved.

Instead of depositing a metal from Group VIII of the Periodic Table of Elements or gold as a first metal, silver may also be deposited as, just like the metals mentioned herein above, it is more noble than copper. In order to make sure, in this case as well, that the first metal layer is not applied to the copper surface in a less compact, porous manner, silver is deposited in this case at a rate that amounts at most to half the rate used to deposit silver in the second step. This permits to make sure that, in this case as well, silver is plated in the second method step with delay to form the solderable and bondable layer. Again it is assumed that the electric potential of the copper surface becomes more positive because of the silver deposits formed.

The thickness of the metal deposits formed in the first method step is extremely small: the first metal layer is not visible on the copper surface. The thickness is probably of less than 5 nm.

If the first metal is palladium, it is deposited from an acidic bath. This bath preferably contains sulfuric acid. The pH of this bath may more specifically amount to zero. It may of course be higher and range from 2 to 3 for example. A bath containing 0.5 mol sulfuric acid in one liter proved particularly suited, though. A preferred sulfuric acid concentration is therefore 0.1-2 mol/l.

This bath may contain palladium in a concentration of 1-100 mg/l, preferably 15-50 mg/l and more specifically about 50 mg/l.

If the first metal is silver, the deposition rate of silver in the first step is preferably regulated by adjusting at least one deposition parameter and/or by adjusting the composition of a bath utilized for deposition.

One deposition parameter by means of which the deposition rate may be regulated is the processing temperature at which the silver deposition bath is run. The temperature may be in the range of room temperature for example or slightly above, and may amount e.g., to 45° C. or less, the preferred temperature ranging from 15 to 45° C., more specifically from 15 to 35° C., and the most preferred temperature ranging from 20 to 35° C.

A deposition bath for silver in the first method step may contain, just like the silver bath for forming the solderable and bondable silver layer in the second method step, silver halide complexes in an acidic solution. The silver ions are preferably utilized as silver methane sulfonate. The concentration of the silver ions in the solution preferably ranges from 0.5 to 5 g/l, more specifically from 0.75 to 2 g/l.

The silver halide complexes most suited are bromide complexes. More detailed indications in this regard will be given hereinafter when descibing preferred compositions of the silver bath utilized in the second method step. The other components of the bath for forming the first silver deposit on the copper surface may correspond to those of the bath for forming the solderable and bondable silver layer in the second method step. The bath for forming the silver deposit in the first method step may additionally contain at least one Cu(I) and at least one Cu(II) complexing agent. Moreover, the bath may contain surface active agents and at least one solubilizer for the Cu(I) complexing agent.

In purposefully adjusting the composition of the deposition bath for silver in the first method step, the deposition rate of silver may be regulated. The afore mentioned Cu(I) complexing agent may be used in the deposition bath or its concentration may be adjusted to a relatively high value in order to achieve a delayed deposition of silver onto the copper surface. The Cu(I) complexing agent may for example be 2,2'-bipyridyl or another compound with the structural component I indicated herein after. The concentration thereof in the deposition bath is preferably set to a value of at most 200 mg/l. The upper limit of said concentration is given by the fact that silver can no longer be deposited under such conditions. Other inhibitors which slow down the deposition of the silver may also be used.

The deposition rate is also function of the acid and pH chosen so that the optimization thereof also permits to regulate the quality of the subsequently deposited silver layer.

The silvering bath of the first method step may further contain all other components described for the silver plating bath of the second method step.

The solderable and bondable silver layer deposited in the second method step is plated onto the pre-plated copper surfaces by plating by a displacement reaction. In this case as well, silver is plated according to equation A as copper dissolves. This means that the bath of preference does not contain any reducing agent. In this case, silver is reduced exclusively, or at least mainly, by a charge transfer displacement reaction with the metal to be plated. The silver ions contained in the bath, preferably silver(I) ions, are reduced to form metallic silver, the copper to be plated oxidizing and dissolving at the same time. The copper surface to be plated is coated with a silver layer until the copper surface is covered with a continuous and non-porous layer of silver. As soon as this condition is achieved, the metal to be plated is no longer contacted with silver ions so that the redox reaction is halted.

The silver bath for forming the solderable and bondable silver layer contains silver ions and at least one Cu(I) complexing agent selected from the group comprising compounds with the structural element I:

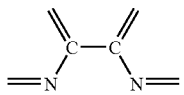

The Cu(I) complexing agent in the silver bath that contains the structural element I may preferably belong to the group of the ferroine compounds. In this case, the complexing agent is provided with the afore mentioned structural element I. The complexing agent may possibly also belong to the cuproine group. In this case, the afore mentioned structural element I is extended as indicated herein after:

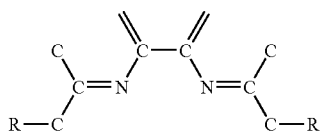

In some cases, the complexing agent may belong to the terroine group, the compounds of which contain the following structural element I" that may be present in two tautomer forms:

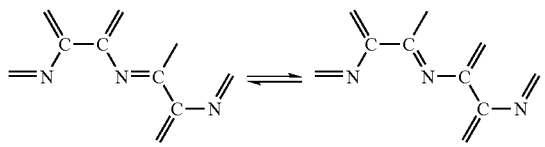

e compounds with the structural element I more specifically have the following structural formula II:

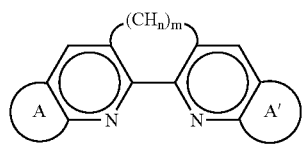

where $(CH_n)_m$ indicates a hydrocarbon bridge, n and m representing, independently of each other, 0 or 1 or 2 and condensed aromatic rings A and A' being possibly provided to the base moiety $C_5N-NC_5$ (in one embodiment of the invention, no rings are condensed to the base moiety).

In the structural formula II, $(CH_n)_m$ preferably stands for an ethenyl group. Furthermore, the rings A and A' bound to the base moiety $C_5N-NC_5$ may represent condensed benzene rings.

The preferred thickness of the solderable and bondable silver layer is less than 1 μm, and more specifically ranges from 0.2 to 0.5 μm. More specifically, the preferred thickness amounts to about 0.2 μm. This value however is, i.a., function of the surface structure of the copper surfaces and of the composition can be formed. The thickness of the solderable and bondable silver layer can be determined by x-ray fluorescence analysis.

The silver bath for the second method step preferably contains at least one Cu(I) complexing agent, selected from the group comprising 2,2'-bipyridine, 1,10-phenanthrolin, 2,6-bis-[pyridyl-(2)]-pyridine, 2,2'-bichinolin(cuproine), 2,2'-bipyridine-5-carboxylic acid, 2,2'-bipyridine-4,4'-dicarboxylic acid, 4,7-dihydroxy-1,10-phenanthrolin, as well as derivatives of these compounds.

The concentration of the at least one Cu(I) complexing agent preferably ranges from 10 to 500 mg/l, preferably from 50 to 100 mg/l, the most preferred concentration ranging from 20 to 30 mg/l.

The silver bath for forming the solderable and bondable silver layer contains silver ions preferably in the form of a silver complex. The bath may for example contain a silver halide complex $(AgCl_{n+1}^{n-})$, more specifically a bromide complex $(AgBr_2^-, AgBr_3^{2-}, AgBr_4^{3-})$. As a matter of course, other complexes such as silver chloride complexes or silver iodide complexes may also be utilized. To produce these complexes, the corresponding silver(I) ions and halide ions are brought to react together by blending a silver(I) salt with a halide salt in a solution. Depending on the molar conditions of the silver(I)-ion compound and of the halide compound, complex anions form in the preferably aqueous solution in accordance with the following equation B:

$$AgX + nX^- \rightarrow AgX^{n-}_{n+1} \qquad B$$

The stability of the complexes increases in the sequence Cl<Br<I. In case of the chloride complexes, the complex anions $AgCl_2^-$ preferably form, in the case of the bromide complexes, the complex anions $AgBr_2^-$ and $AgBr_3^{2-}$. To produce the halogenide complexes, silver alkane sulfonate, more specifically silver methane sulfonate, silver acetate or silver sulfate can be mixed in the aqueous bath solution with the alkali or earth alkali halides or with the hydrogen halides bath solution with the alkali or earth alkali halides or with the hydrogen halides in a stoichiometric ratio, the complex anions forming thereby. These anions preferably also form when mixing the two species when these are not mixed in the stoichiometric ratio (e.g., 0.01 mol of $Ag^+$ for 2 to 3 mol of halide). A source of halide ions is preferably utilized in excess. For most applications, the silver ion concentration in the bath is adjusted to approximately 1 g/l. The concentration may range from 0.1 to 20 g/l, the most preferred concentration ranging from 0.5 to 3 g/l.

In utilizing silver halide complex compounds that are dissolved in the solution in an excess of dissolved alkali halide, stable silver plating bath solutions in water may be formed. In such a solution, the amount of free silver ions $(Ag^+)$ is reduced so much that stable silver layers with a high bonding strength are formed by way of the displacement reaction between copper metal and silver ions. The baths are stable to acids so that the silver layers may also be deposited when the pH of the silver bath is low and the bath is strongly acid.

The pH of the silver bath is adjusted to a value ranging from 0 to 7, preferably from 4 to 6 and more specifically to about 5.5 by means of pH adjusting means with acids or bases such as the hydrogen halides corresponding to the complex anions, i.e., hydrochloric acid, hydrobromic acid and/or hydriodic acid, or with a caustic alkali or carbonate.

Instead of, or in addition to, the hydrogen halides, the silver bath may contain other acids. In principle, all of the known mineral acids and/or organic acids as well as the mixtures thereof are suited.

In order to make certain that the printed circuit boards can be repeatedly contacted with liquid solder without the solderability being affected thereby, the silver layers formed must be as continuous and non-porous as possible, since otherwise one single soldering procedure may cause oxide layers to form on the bare areas of the copper surfaces. In this case, the ability of the overall surface to be wetted by the solder would be considerably affected. Normally hence, the plated silver layers must be relatively thick in order to meet the requirements mentioned. In the present case however, silver layers of 0.2-0.3 μm thick suffice.

To this purpose, the silver bath may also contain at least one Cu(II) complexing agent. The complexing agents of preference belong to the group comprising polyamines, amino carboxylic acids and amino phosphonic acids. Ethylene diamine, alanine diacetic acid, amino trimethylene phosphonic acid, diethylene triamine pentamethylene phosphonic acid and 1-hydroxyethylene-1,1-diphosphonic acid are particularly suited. The concentration of the Cu(II) complexing agent preferably ranges from 5 to 500 mg/l, the most preferred concentration ranging from 20 to 150 mg/l.

In using the Cu(II) complexing agent, the formation of gaps and pores in the silver layer is further reduced. As reaction products from the copper originating from the displacement reaction particularly gather in the pores of the silver layer, the displacement reaction is presumably hindered. The Cu(II) complexing agent obviously serves to better solubilize the Cu(II) ions so that the displacement transfer reaction is facilitated.

In adding the Cu(I) complexing agent to the silver bath, the plating rate is reduced. If, for example, in plating silver by way of a displacement plating within 5 minutes at a temperature of 50° C. a silver layer of 0.6 μm thick on pre-plated copper is obtained when the bath does not contain any Cu(I) complexing agent, the thickness is reduced to 0.4 μm after the addition of 5 mg of 2,2'-bipyridine for example. In adding the Cu(I) complexing agent, the appearance of the layer is improved and the tendency to form dendrites is reduced. In using the silver bath, even light microscope examination shows uniform crystalline silver layers without any dendrites.

However, the bonding strength and solderability of such layers proved insufficient for printed circuit board production. To this purpose, the concentration of the Cu(I) complexing agent in the silver bath is increased. For, if the amount of 2,2'-bipyridine is increased to 10-100 mg/l, the silver layers obtained are tightly adherent. Light microscope examination with a magnification of even 500-1000 times showed a fine-grained layer; dendrites could not be observed under these conditions. Microscope examination did not show any pores so that no bare copper areas are to be seen. However, under these conditions, the average thickness of the silver layer is further reduced to 0.2-0.3 μm. Silvery bright silver layers obtained in this way still pass the necessary solder tests without any problem even after having been subjected to dry heat and to a vapor test. The necessary storing properties are thus guaranteed. An optical discoloration of the silver layer after the ageing tests described herein above was not observed; even after ageing the layers were bright and silvery.

The silver bath can additionally contain at least one solubilizer for the Cu(I) complexing agent, a polyglycol ether for example such as a polyethylene glycol, a polypropylene glycol and/or a copolymer or a block polymer of ethylene glycol and propylene glycol. The concentration of the solubilizer preferably ranges from 5 to 500 g/l, the most preferred concentration ranging from 20 to 150 g/l.

Furthermore, the silver bath can also contain a surface active agent such as a non-ionic surface active agent, more specifically a polyamide. The most preferred surface active agents are copolymerisates and preferably block polymerisates of polyamides and polyethers, more preferably block polymers made from lactames such as y-butyrolactame (2-pyrrolidone), δ-valerolactame (2-piperidone) and/or ε-caprolactame, with polyethylene glycol (polyethylene oxide) and/or polypropylene glycol (polypropylene oxide). Instead of the polymers of the unsubstituted lactames, polymers of the substituted lactames, more specifically of the alkyl substituted lactames, may also be used. The degree of polymerization of the two components may be varied within wide ranges. The molecule of the surface active agent may contain the polyamide component at a degree of polymerization of 2-200, preferably of 2-50, a more preferred degree amounting to 3-20 and the most preferred degree of polymerization ranging from 4-5 and the polyether component at a degree of polymerization of 5-500, preferably of 10-100, a more preferred degree amounting to 25-50 and the most preferred degree of polymerization ranging from 35-45. Polycaprolactame, which is block polymerized with polyethylene glycol, e.g., the product Lurotex® A25 of BASF, Germany is particularly suited to be used as a surface active agent. The surface active agent is utilized in a very low concentration of e.g., 5-100 mg/l of the bath.

The surface active agent may of course also be utilized in the silver bath described herein above in carrying out a method by which, prior to the plating of silver from the silver bath, the first method step in accordance with the invention comprising depositing a first metal such as palladium, gold or silver onto the copper surface is not carried out.

The use of this surface active agent permits to achieve an even denser layer of silver. This means that corrosion tendency post ageing is reduced. The layer is found to exhibit less pores to be formed. This may be seen with a light microscope e.g. after ageing a plated copper substrate in a steam test. If this surface active agent is not used in the silver plating bath slightly brownish stains on the silver surface may be detected, especially if no metal is deposited in a first method step, these stains originating from copper corrosion products in the areas where pores are formed. Due to the formation of a dense silver layer using the polyamide surface active agent the silver immersion plating process ceases more quickly as the substrate is no longer accessible to the plating solution since there are less pores.

Silver already plates from the metal-plating baths onto the copper surface at a temperature below 20° C. The plating rate may be influenced by the temperature of the bath and of the silver ion concentration. Therefore, the temperature of the deposition bath utilized in the first method step may be selected in the range from 20 to 35° C. By contrast, the silver bath utilized in the second method step is preferably adjusted to an operating temperature ranging from 35 to 65° C. in order to more quickly deposit silver.

The thickness required for the silver layer is achieved in a very short time in the second method step. Within 1-10 minutes, a silver layer of 0.2-0.5 μm thick is plated. Therefore, the silver bath is very well suited for horizontal printed circuit board production. The choice of the acid and of the pH also determine the plating rate.

To carry out the method in accordance with the invention, the metal-plating baths are prepared and the metal surfaces are brought into contact therewith. Usually, the printed circuit boards are suspended vertically and immersed into the tanks provided for the purpose and filled with the processing fluid (immersion technique). As an alternative, processing plants may be utilized in which the boards are held in horizontal position and through which they are conveyed in horizontal direction (horizontal conveyorized method). In this case, the processing fluid is delivered through nozzles (spray nozzles, jet nozzles, flow nozzles) to one or both sides of the surfaces of the boards conveyed and guided by means of appropriate conveying means (rolls, clamps). In the horizontal plants, the boards can also be conveyed through the plant in vertical position and in horizontal direction of transport.

Prior to silver-plating the copper surfaces, the areas are preferably cleaned and roughened in order to enhance the bonding strength of the silver layer on the substrate. An acidic processing solution containing surface active agents may for example be utilized for cleaning. This is not absolutely necessary though, when the boards have been handled properly prior to silver-plating.

If need be, the boards are then rinsed to remove residual cleansing fluid from the copper surfaces.

Thereafter, the copper surfaces may be roughened and/or cleaned with a chemical etch solution. For this purpose, acidic etch solutions in use in printed circuit board production may be utilized that contain at least one peroxo compound such as an acidic solution of alkali peroxodisulfate, alkali caroate or hydrogen peroxide, more specifically of sodium peroxodisulfate. As an alternative, an etch solution of copper(II) chloride may also be used. After the treatment with the etch solution, the board is usually rinsed once more prior to contacting it with the acidic silver bath.

Once silver-plating is completed, the board is generally rinsed again and then dried.

The following examples of the invention serve to explain the invention in closer detail.

EXAMPLE 1

Printed circuit board material (printed circuit board portion of 5 cm×5 cm) with external copper laminate was treated in vertical technique as described herein after:

The material was first cleaned and superficially etched with current methods. After rinsing, the material was treated in a first method step for 30 seconds at room temperature with a deposition solution containing

| | |
|---|---|
| $PdSO_4$ | 50 mg $Pd^{2+}$/l |
| $H_2SO_4$, conc. | 5 percent by weight. |

After rinsing, the material was then treated in a second method step for 5 minutes at 50° C. with a silver plating bath containing

| | |
|---|---|
| silver methane sulfonate | 1 g $Ag^+$/l |
| NaBr | 320 g/l |
| Dequest 2066A *) | 30 ml/l |
| polyethylene glycol 400 | 80 ml/l |

-continued

| | |
|---|---|
| 2,2'-bipyridyl | 90 mg/l |
| Lurotex ® A25 | 20 mg/l |
| pH | 5.5 |

*) diethylene triamine pentamethylene phosphonic acid

Air was continuously blown into the silver plating bath during treatment. Then, the material was again thoroughly rinsed in deionized water and eventually dried.

In the first method step of the treatment, no discoloration of the copper surface could be observed. After a treatment of 30 seconds in the second method step however, the color turned silvery. After 5 minutes, a continuous silver layer was formed.

After subjecting the material to ageing for 4 hours in dry heat at 155° C., no discoloration of the silver layer could be observed. The thickness of the layer is uniform.

The solderability of a material treated in this way was examined by means of a solder wetting balance. To this purpose, a small strip of material was attached to a balance and slowly immersed into liquid solder at 235° C. The forces (Fr [mN/mm]) occurring during wetting were recorded as a function of the time t [s]. Wetting was completed already after less than half a second.

COMPARATIVE EXAMPLE

Example 1 was repeated. Unlike in Example 1 however, the material was not treated in the sulfuric acid solution of palladium sulfate but was immediately treated in the silver bath after cleaning and etching.

The thickness of the layer is not uniform. It is "cloudy".

After 4 hours of an ageing test under dry heat at 155° C., wetting profiles were obtained with identically produced samples. In these cases, a period of time of 0.7 seconds was recorded before the material surfaces were completely wetted with liquid solder.

EXAMPLE 2 AND COMPARATIVE EXAMPLE

After the usual pretreatment with an acidic cleaner and with an etch cleaner, wetting balance test coupons were treated for one minute in an displacement plating gold bath consisting of

| | |
|---|---|
| $KAu(CN)_2$ | 3 g $Au^+$/l |
| EDTA | 60 g/l | at a pH of 8 and at a temperature of 80° C. and then plated in the silver bath indicated in Example 1 for 6 minutes at 50° C., the bath did not contain the surface active agent Lurotex® A25 though.

After having been subjected to ageing for 4 hours at 100° C. and 100% relative humidity (vapor test), the solder samples showed a considerably improved wetting behavior over a sample that was plated in the same way except for the gold bath that was omitted. The results of the wetting balance test described in Example 1 yielded a wetting time of 0.3 seconds when gold plating was previously performed and a wetting time of again at least 0.7 seconds when previous gold plating was left out.

Further this experiment was again conducted without treating the board material first with the displacement plating gold bath but only with the silver bath indicated in Example 1, this bath containing Lurotex® A25 in the concentration given in Example 1. The results of the wetting balance test were comparable to the results obtained when the material was first treated with the displacement plating gold bath and then with the silver bath without this surface active agent. It has also been found out that the layer was slightly thinner than in this latter case, which may obviously be due to the fact that the silver layer formed is generally more dense if this surface active agent is used.

EXAMPLE 3 AND COMPARATIVE EXAMPLE

Copper laminated base material (5 cm×5 cm) and solder test coupons were cleaned and slightly etched according to Example 1. Then, the material was treated for 30 seconds at 25° C. in a silver deposition bath that had the following composition:

| | |
|---|---|
| silver methane sulfonate | 1 g $Ag^+$/l |
| NaBr | 320 g/l |
| Dequest 2066A *) | 30 ml/l |
| polyethylene glycol 400 | 80 ml/l |
| 2,2'-bipyridyl | 90 mg/l |
| pH | 5.5 |

*) diethylene triamine pentamethylene phosphonic acid

Then, the material was treated for 6 minutes at 50° C. in a silver plating bath with the same composition (pH 5.5). The silver layer obtained was uniform, silvery and bright, defect free and had good soldering properties.

For comparison, a reference sample was treated after cleaning and etching in the second silver bath only. The silver layer obtained had a cloudy appearance with distinct streaks. The solderability of the layer was considerably poorer than that of the first sample.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. A method of plating silver on a substrate by a displacement plating reaction provided with a copper surface comprising:
   a) depositing silver on the substrate in a first method step, and
   b) plating silver on said substrate in a second method step, wherein silver is deposited in the first method step at a rate that is at most half the rate of plating of silver in the second method step, and
   wherein the rate of silver deposition from a silver deposition bath in the first method step is regulated by adjusting at least one deposition parameter and/or by adjusting the composition of the silver bath.

2. The method according to claim 1, wherein the rate of silver deposition in the first method step is regulated by adjusting the processing temperature.

3. The method according to claim 1, wherein the rate of deposition of the silver in the first method step is regulated by using a Cu(I) complexing agent in the silver bath.

4. The method according to claim 1 wherein silver is plated in the second method step with a plating bath containing at least one silver halide complex.

5. The method according to claim 4, wherein the silver halide complex is a silver bromide complex.

6. The method according to claim 1, wherein silver is plated in the second method step with a bath having a pH ranging from 4 to 6.

7. The method according to claim 1, wherein silver is plated in the second method step with a plating bath that additionally contains at least one Cu(I) complexing agent.

8. The method according to claim 7, wherein the at least one Cu(I) complexing agent is selected from the group consisting of 2,2' bipyridine, 1,10-phenanthrolin, 2,6-bis-[pyridyl-(2)]-pyridine, 2,2'-bichinolin, 2,2-bipyridine-5-carboxylic acid, 2,2'-bipyridine-4,4'-dicarbocylic acid, 4,7-dihydroxyl-1,10-phenanthrolin as well as derivatives thereof.

9. The method according to claim 1, wherein silver is plated in the second method step with a plating bath that additionally contains at least one Cu(II) complexing agent.

10. The method according to 9, wherein the at least one Cu(II) complexing agent is selected from the group consisting of ethylene diamine, alanin diacetic acid, amino trimethylene phosphonic acid, diethylene triamine pentamethylene phosphonic acid and 1-hydroxyethylene-1,1-diphosphonic acid.

11. The method according to claim 1 wherein silver is plated in the second method step with a plating bath that additionally contains at least one surface active agent.

12. The method according to claim 1, wherein the substrate is cleaned and/or etched prior to performing the first method step.

13. The method according to claim 12, wherein, for cleaning and/or etching, the substrate is contacted with an acidic solution containing at least one peroxo compound selected from the group consisting of alkali peroxo disulfate, alkali caroate and hydrogen peroxide prior to performing the first method step.

14. The method according to claim 1, wherein the method is carried out as a horizontal conveyorized method.

15. The method according to claim 1, wherein the substrate is a printed circuit board material and wherein in the second method step silver is plated for subsequently performing a soldering process, a bonding process, for press-fit technology and/or for making electrical contacts.

* * * * *